United States Patent [19]

Liebgen

[11] Patent Number: 5,090,247
[45] Date of Patent: Feb. 25, 1992

[54] SEMICONDUCTOR PRESSURE SENSOR CONNECTED TO A SUPPORT ELEMENT

[75] Inventor: Manfred H. Liebgen, Bruckberg, Fed. Rep. of Germany

[73] Assignee: Texas Instruments Deutschland GmbH, Fed. Rep. of Germany

[21] Appl. No.: 609,980

[22] Filed: Nov. 6, 1990

[30] Foreign Application Priority Data

Nov. 10, 1989 [DE] Fed. Rep. of Germany ....... 3937522

[51] Int. Cl.⁵ ............................ G01L 7/08; G01L 9/06
[52] U.S. Cl. ......................................... 73/727; 73/756; 338/4
[58] Field of Search ................. 73/756, 720, 721, 726, 73/727; 338/4

[56] References Cited

U.S. PATENT DOCUMENTS

| | | | |
|---|---|---|---|
| 4,656,454 | 4/1987 | Rosenberger | 73/720 |
| 4,665,754 | 5/1987 | Glenn et al. | 73/708 |
| 4,774,843 | 10/1988 | Ghiselin et al. | 73/727 |
| 4,852,581 | 8/1989 | Frank | 73/726 |

FOREIGN PATENT DOCUMENTS 0115074  8/1984  European Pat. Off. ............. 73/727

*Primary Examiner*—Donald O. Woodiel
*Attorney, Agent, or Firm*—William E. Hiller; Richard L. Donaldson

[57] ABSTRACT

A semiconductor pressure sensor (10) includes a substrate (12) as semiconductor material which comprises an active surface (14) for receiving integrated components (26, 28) and a rear side (16) in which to form a diaphragm (20) adjoining the active surface (14) and exposed to the pressure to be measured a recess surrounded by thick edge regions (22, 24) is formed. On the active surface (14) integrated components are provided which under the influence of mechanical deformations of the diaphragm (20) vary one of their electrical parameters. The substrate (12) is connected to the support element (34) in the region of the active surface (14) surrounding the diaphragm (20) by using an elastomer seal (40). The diaphragm (20) is in communication from the rear side of the substrate (12) with a supply conduit (44) for the pressure to be measured.

9 Claims, 1 Drawing Sheet

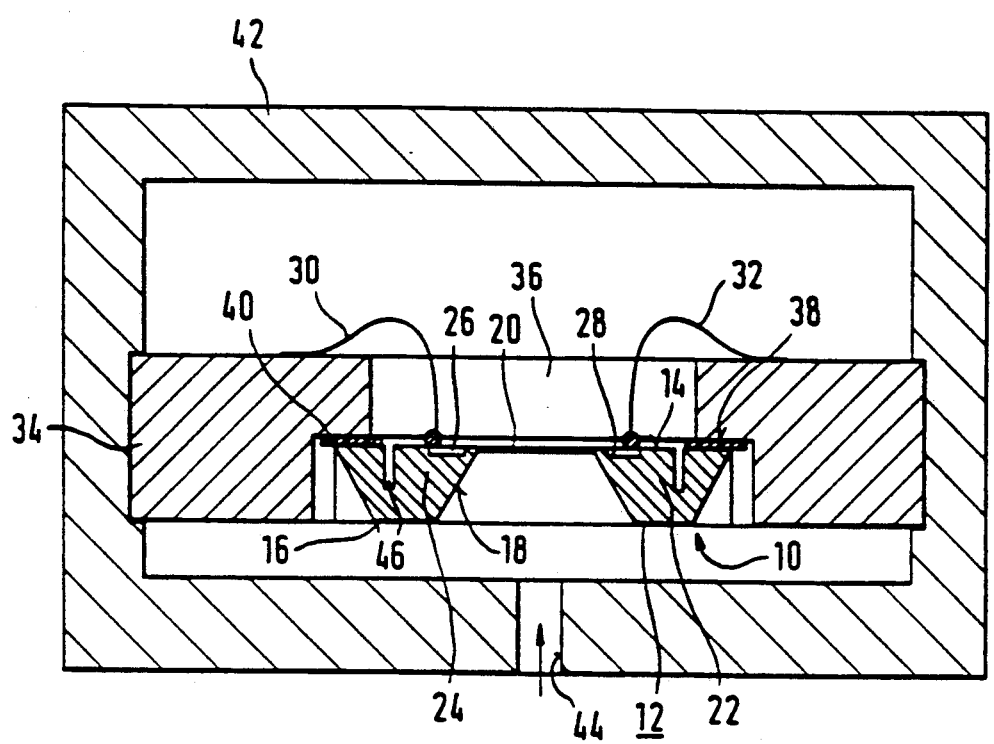

SEMICONDUCTOR PRESSURE SENSOR CONNECTED TO A SUPPORT ELEMENT

The invention relates to a semiconductor pressure sensor connected to a support element and comprising a substrate of semiconductor material which has an active surface for receiving integrated components and a rear side in which to form a diaphragm adjoining the active surface and exposed to the pressure to be measured a recess surrounded by thick edge regions is formed, integrated components being provided on the active surface and varying one of their electrical parameters under the influence of mechanical deformations of the diaphragm.

Semiconductor pressure sensors of this type were adhered to edge regions surrounding the diaphragm on the side of the substrate back. The adhesive action was produced by the adhesion forces between the materials involved. The pressure to be measured is caused to act on the diaphragm from the rear side of the substrate. However, this means that the pressure to be measured exerts a force which tends to overcome the adhesion forces between the substrate and the support element and as a result at excessive pressures the bond between the substrate and support element is detached. This makes the pressure sensor useless. This problem could not simply be overcome connecting the thick edge regions of the substrate with mechanical means from the active surface of the substrate fixedly to the support element. For with such a solution mechanical stresses would be produced in the diaphragm which result from temperature changes and the consequent dimensional changes of the securing structure. These mechanical stresses generate in the diaphragm undesired electrical output signals which superimpose themselves on the output signals caused by the pressure to be measured and thus lead to a falsification of the measurement results. Pressure sensors of the type mentioned at the beginning can thus be used only for a very limited pressure range and this is particularly true when attention must be paid to as stressfree as possible a mounting of the pressure sensor and thus to measurement results falsified as little as possible.

The invention is based on the problem of providing a semiconductor pressure sensor of the type mentioned at the beginning which is suitable for use at high pressures and the output signals of which are hardly influenced by form changes of the support element.

According to the invention this problem is solved in that the substrate is connected at the regions of the active surface surrounding the diaphragm to the support element using an elastomer seal and that the diaphragm is in connection from the rear side of the substrate with a supply conduit for the pressure to be measured.

In the semiconductor pressure sensor according to the invention the connection to the support element is on the active surface of the substrate with interposition of an elastomer seal. This means that under the action of pressure on the diaphragm a force arises on the joint between the pressure sensor and the support element and makes the sealing action the greater the greater the pressure. An additional rigid clamping of the substrate to the support element is not necessary and consequently the desired independence from mechanical deformations of the support element is achieved.

Advantageous further developments of the invention are characterized in the subsidiary claims.

The invention will now be explained by way of example with reference to the drawing in which the pressure sensor according to the invention is illustrated in a sectional view with its features essential to the invention.

The pressure sensor 10 illustrated in the drawing includes a semiconductor substrate 12 which has an active surface 14 and a rear side 16. Formed in the rear side 16 is a recess 18 so that a diaphragm 20 adjoining the active surface 14 is formed and is surrounded by thick edge regions 22, 24.

Formed in the active surface 14 are integrated components, for example integrated resistors 26, 28, which on deformation of the diaphragm 20 likewise undergo a mechanical dimensional or shape change and vary one of their electrical parameters, in the example given their resistance.

The electrical signals are supplied to and from the integrated components 26, 28 by means of bond wires 30, 32.

The pressure sensor 10 is disposed in a support element 34 which is provided with an opening 36 of which the inner peripheral surface forms a step 38. The pressure sensor 10 is adhered to the step 38 of the support element 34 with interposition of an elastomer seal 40. The adhesive action results from the adhesion force active between the materials involved. As material for the elastomer seal for example silicone rubber, butyl rubber or also nitrile rubber may be used. Any other material with comparable properties can of course be employed.

The support element 34 is mounted in turn in a housing 42 which has an opening 44 for introduction of the pressure to be measured. As apparent in the drawing the pressure acts on the face of the diaphragm 20 facing the rear side of the pressure sensor 10. As a result, the pressure acting generates a force which intensifies the sealing action of the elastomer 40 to an extent which is greater the higher the pressure. Because of its special mounting the pressure sensor 10 can therefore be employed for high pressures.

For mechanical uncoupling between the support element 34 and the pressure sensor 10 a depression 46 surrounding the diaphragm can be formed in the active surface of the substrate 12 in the region between the diaphragm 20 and the connecting region to the support element 34. In this manner, mechanical deformations caused by temperature changes in the support element are prevented from causing deformations of the diaphragm 20 which would result in a falsification of the measurement result. This mechanical decoupling effective in addition to the use of the elastomer seal 40 permits hysteresis-free measurement results which are very extensively free from temperature influences.

If a further mechanical decoupling is desired a plurality of depressions similar to the depression 46 may be formed in the thick edge regions 22, 24 of the substrate. Formation of such depressions from the rear side of the substrate 12 is also possible.

In the drawing the pressure sensor 10 is indicated only schematically; it need not be particularly shown how electrical signals are supplied and carried away because this is not essential to the invention.

I claim:

1. A pressure sensor comprising:

said semiconductor substrate being provided with a recess in the second major surface thereof extending toward the first major surface so as to define relatively thick peripheral edge regions bounding the recess and a relatively thin pressure-sensitive diaphragm extending between said relatively thick edge regions and connected thereto;

a support element having an opening therethrough and providing an inner peripheral support surface in opposed relation to the first major surface at the relatively thick peripheral edge regions of said semiconductor substrate;

elastomeric means interposed between said inner peripheral support surface of said support element and the first major surface at the relatively thick peripheral edge regions of said semiconductor substrate and providing a peripheral seal between said inner peripheral support surface of said support element and the first major surface at the relatively thick peripheral edge regions of said semiconductor substrate;

at least one integrated component provided in a relatively thick edge region of said semiconductor substrate adjacent to said pressure-sensitive diaphragm and opening onto the first major surface of said semiconductor substrate;

the second major surface of said semiconductor substrate being free of obstruction and positioned for exposure to pressure introduced into the opening through said support element;

the relatively thin pressure-sensitive diaphragm of said semiconductor substrate being disposed in the opening through said support element and being responsive to pressure introduced into the opening through said support element and entering the recess provided in said semiconductor substrate to undergo mechanical deformation;

said at least one integrated component having an electrical parameter subject to variation in response to mechanical deformation of said pressure-sensitive diaphragm under the influence of pressure, the variation in the electrical parameter of said at least one integrated component being proportional to the magnitude of the mechanical deformation of said pressure-sensitive diaphragm, thereby being indicative of a measurement of the pressure to which said relatively thin pressure-sensitive diaphragm is exposed; and the sealing action of said elastomeric means between said inner peripheral support surface of said support element and the first major surface at the relatively thick peripheral edge regions of said semiconductor substrate increasing in response to the introduction of the pressure being measured into the opening through said support element and through the recess provided in said semiconductor substrate to impinge upon the relatively thin pressure-sensitive diaphragm of said semiconductor substrate.

2. A pressure sensor as set forth in claim 1, wherein a plurality of integrated components are provided in said relatively thick edge regions of said semiconductor substrate adjacent to said relatively thin pressure-sensitive diaphragm, each of said integrated components opening onto the first major surface of said semiconductor substrate and having respective electrical parameters subject to variation in response to mechanical deformation of said relatively thin pressure-sensitive diaphragm under the influence of pressure.

3. A pressure sensor as set forth in claim 2, wherein said plurality of integrated components are resistors.

4. A pressure sensor as set forth in claim 1 wherein said support element is provided with a counterbore to define a shoulder along the inner periphery thereof at the juncture between the opening and the counterbore and extending outwardly from the opening for providing said inner peripheral support surface to which the first major surface at the relatively thick peripheral edge regions of said semiconductor substrate is in opposed relation with said elastomeric means interposed therebetween.

5. A pressure sensor as set forth in claim 4, further including a housing defining a chamber in which said support element is fixedly mounted; and
    said housing having an input port in registration with the counterbore and the opening in said support element and the recess provided in said semiconductor substrate for introduction of the pressure to be measured.

6. A pressure sensor as set forth in claim 1, wherein mechanical decoupling means are provided between said support element and said relatively thin pressure-sensitive diaphragm of said semiconductor substrate for preventing mechanical deformations in said semiconductor substrate caused by temperature changes in said support element from causing mechanical deformations of said relatively thin pressure-sensitive diaphragm.

7. A pressure sensor as set forth in claim 6, wherein said mechanical decoupling means comprises a depression formed in said relatively thick peripheral edge regions of said semiconductor substrate and surrounding said relatively thin pressure-sensitive diaphragm, said depression opening onto the first major surface of said semiconductor substrate and being disposed between said relatively thin pressure-sensitive diaphragm and said elastomeric means providing the peripheral seal between the first major surface at the relatively thick peripheral edge regions of said semiconductor substrate and said inner peripheral support surface of said support element.

8. A pressure sensor as set forth in claim 1, wherein said elastomeric means is made of a material taken from the class including silicone rubber, butyl rubber and nitrile rubber.

9. A pressure sensor comprising:
    a substrate of semiconductor material having first and second major surfaces;
    said semiconductor substrate being provided with a recess in the second major surface thereof extending toward the first major surface so as to define relatively thick peripheral edge regions bounding the recess and a relatively thin pressure-sensitive diaphragm extending between said relatively thick edge regions and connected thereto;
    a support element having an opening therethrough and providing an inner peripheral support surface in opposed relation to the first major surface at the relatively thick peripheral edge regions of said semiconductor substrate;
    elastomeric means interposed between said inner peripheral support surface of said support element and the first major surface at the relatively thick peripheral edge regions of said semiconductor substrate and providing a peripheral seal between said inner peripheral support surface of said support element and the first major surface at the relatively thick peripheral edge regions of said semiconductor substrate;

at least one integrated component provided in a relatively thick edge region of said semiconductor substrate adjacent to said pressure-sensitive diaphragm and opening onto the first major surface of said semiconductor substrate;

the second major surface of said semiconductor substrate being free of obstruction and positioned for exposure to pressure introduced into the opening through said support element;

the relatively thin pressure-sensitive diaphragm of said semiconductor substrate being disposed in the opening through said support element and being responsive to pressure introduced into the opening through said support element and entering the recess provided in said semiconductor substrate to undergo mechanical deformation;

said at least one integrated component having an electrical parameter subject to variation in response to mechanical deformation of said pressure-sensitive diaphragm under the influence of pressure, the variation in the electrical parameter of said at least one integrated component being proportional to the magnitude of the mechanical deformation of said pressure-sensitive diaphragm, thereby being indicative of a measurement of a pressure to which said relatively thin pressure-sensitive diaphragm is exposed; the sealing action of said elastomeric means between said inner peripheral support surface of said support element and the first major surface at the relatively thick peripheral edge regions of said semiconductor substrate increasing in response to the introduction of the pressure being measured into the opening through said support element and through the recess provided in said semiconductor substrate to impinge upon the relatively thin pressure-sensitive diaphragm of said semiconductor substrate;

said semiconductor substrate being provided with a depression formed in said relatively thick peripheral edge regions of said semiconductor substrate and surrounding said relatively thin pressure-sensitive diaphragm, said depression opening onto the first major surface of said semiconductor substrate and being disposed between said relatively thin pressure-sensitive diaphragm and said elastomeric means providing the peripheral seal between the first major surface at the relatively thick peripheral edge regions of said semiconductor substrate and said inner peripheral support surface of said support element; and said depression being disposed inwardly with respect to said inner peripheral support surface of said support element for isolating said relatively thin pressure-sensitive diaphragm of said semiconductor substrate from mechanical deformations in said support element caused by temperature changes in said support element.

* * * * *